United States Patent [19]
Hush et al.

[11] Patent Number: 5,506,814
[45] Date of Patent: Apr. 9, 1996

[54] VIDEO RANDOM ACCESS MEMORY DEVICE AND METHOD IMPLEMENTING INDEPENDENT TWO WE NIBBLE CONTROL

[75] Inventors: Glen Hush, Boise; Mike Seibert, Eagle; Jeff Mailloux; Mark R. Thomann, both of Boise, all of Id.

[73] Assignee: Micron Technology, Inc., Boise, Id.

[21] Appl. No.: 69,967

[22] Filed: May 28, 1993

[51] Int. Cl.⁶ .................................................. G11C 8/00
[52] U.S. Cl. ........................... 365/230.03; 365/189.01; 365/230.05
[58] Field of Search .................. 365/189.01, 230.03, 365/230.05

[56] References Cited

U.S. PATENT DOCUMENTS

| | | | |
|---|---|---|---|
| 4,604,695 | 8/1986 | Widen et al. | 364/200 |
| 4,636,986 | 1/1987 | Pinkham | 365/195 |
| 4,675,850 | 6/1987 | Kumanoya et al. | 365/230 |
| 4,695,967 | 9/1987 | Kodama et al. | 364/521 |
| 4,725,987 | 2/1988 | Cates | 365/220 |
| 4,779,232 | 10/1988 | Fukunaka et al. | 365/189 |
| 4,847,809 | 7/1989 | Suzuki | 365/189.01 |
| 4,875,189 | 10/1989 | Obara | 365/189.04 |
| 4,876,671 | 10/1989 | Norwood et al. | 365/233 |
| 4,879,685 | 11/1989 | Takemae | 365/189.11 |
| 4,881,206 | 11/1989 | Kadono | 365/227 |
| 4,958,326 | 9/1990 | Sakurai | 365/218 |
| 5,042,013 | 8/1991 | Sato | 365/230.05 |
| 5,381,376 | 1/1995 | Kim et al. | 365/230.03 |

OTHER PUBLICATIONS

1992 DRAM Electrical data book, Micron Technology, Inc., pp. 2/115–2/131.

*Primary Examiner*—Do Hyun Yoo
*Assistant Examiner*—F. Niranjan
*Attorney, Agent, or Firm*—Susan Collier

[57] ABSTRACT

The invention is a monolithic video random access memory (VRAM) chip that has more than one write control pin which is used to segment the VRAM into banks or sub-chips having four DQ planes such that a nibble of data can be written to the VRAM. Using the method of the invention a first bank may be written independently of a second bank, such that during a single memory cycle the first bank may be written and the second bank may be read. The VRAM of the invention functions without the masking of a write to either bank. In addition the write memory function can be performed either through the random access memory port or through the serial access memory port.

37 Claims, 4 Drawing Sheets

VIDEO RANDOM ACCESS MEMORY DEVICE AND METHOD IMPLEMENTING INDEPENDENT TWO WE NIBBLE CONTROL

FIELD OF THE INVENTION

The invention relates to memory devices and, more particularly, to semiconductor memories having video random access memories.

BACKGROUND OF THE INVENTION

In integrated circuit (IC) memory products, such as dynamic random access memories (DRAMs) and video random access memories (VRAMs), the amount of available memory on a monolithic chip is often referred to as the density. Density describes the total amount of memory fabricated on the circuit of the chip, such as 1 meg, 4 meg, and so forth.

FIG. 1 depicts a common DRAM array 5 containing a large number of memory storage cells 10. Each memory storage cell 10 is addressable by a unique row 15 and a unique column 20 address. If there are n rows 15 and m columns 20 the density is equal to nxm. In the example the density is equal to 8×2 or 16.

A memory device, such as DRAM array 5, accepts electrical data for storage through an input often called the "D" input. Electrical data read from the memory would be presented on an output called the "Q" output. In order to keep the package small the input and output functions are commonly combined to share the same pin which is now called a "DQ" pin 25. In the example, the complementary electrical data is available on the D/Q* pin 30.

FIG. 2 is a simplified block schematic of memory array 5 of FIG. 1. In FIG. 2 the block schematic indicates the actual manner in which the rows and columns are configured, 8×2. However when referring to a chip it is typically described by its total density, in this case 16.

Memory vendors often provide more than one configuration of a certain density product to better suit the needs of the consumer. In some popular variations the memory is split into 4, 8, 16 or more equal segments. These segments are accessed in parallel. Each segment of the array can be thought of as a subarray having a given density. Often m and n are equal in each subarray. The number of subarrays is referred to as the width of the memory array. In a memory containing subarrays, less row and column addresses are required for a total given memory capability since the density of each subarray is only a portion of the total memory density, and since the subarrays typically respond to the same row and column address. Such a configuration multiplies the "D" and "Q" pins required for transferring electrical data into and out of the IC. Each "DQ" pin services one of the afore mentioned subarrays which is then often referred to as a "DQ plane."

The division of the memory array into equal sided and commonly addressed DQ planes is very useful in certain systems which use IC memory. The various available configurations are often referred to as "by one", "by four", "by eight" and so forth. For example a 1 meg VRAM may be split into 4 DQ planes and is then referred to as a 256K×4.

Computers handle data in chunks of 8 bits at a time, so a by 8 product is appealing as a configuration for some monolithic memory chips. A by 16 product is also appealing for monolithic chips having high bandwidth applications. Since computers work on 8 bits at a time, at the by 16 level a method of writing to only 8 bits at a time is needed. This problem is solved by putting either two write control pins or two CAS pins on these chips.

For example, pages 2–115 through 2–131 of the 1992 DRAM Electrical data book by Micron Technology, Inc. describe the circuit configuration, timing, and functions of a MT4C1664/5L and are herein incorporated by reference to provide the reader with further information. The MT4C1664/5L is a 64K×16 monolithic DRAM memory chip featuring two write control input pins. One write control input pin accepts a WEL* signal and the remaining write control input pin accepts a WEH* signal, thereby allowing for a byte write access cycle. WEH* is the write enable signal to the upper byte which is represented by data at DQ9 through DQ16. WEL* is the write enable signal to the lower byte which is represented by data at DQ1 through DQ8. In this case WEL* and WEH* function in an identical manner to the typical normally low write enable (WE*) signal of a DRAM featuring a single write control input pin. Either WEL* or WEH* will generate an internal WE* through an AND gate. Thus if either WEL* or WEH* is active the entire chip goes into a write mode. However, only the bank having the active signal actually writes. The device can write to a byte or block the write to the byte. The block of the write to the byte is also known as masking of the write function. There is no Byte read cycle.

FIG. 3 is an example of a 2 Meg 256K×8 monolithic VRAM chip 34. A VRAM is a dual port DRAM used to store electrical data which can represent video images on a video monitor. When the electrical data represents video images it is referred to as video data. The serial access memory (SAM) port 35 accepts output video data from a SAM array portion 36 of the VRAM in a read mode and accepts external input video data in a write mode. Video data for controlling video images transfers quickly between the SAM 36 and SDQs 1–8 at the SAM port 35 either as video input or video output data. Random access memory (RAM) port 37 accepts internal digital electrical data from a DRAM array portion 38 of the VRAM in a read mode and accepts external digital electrical data in a write mode.

The DRAM portion 38 of the 2 Meg memory has been split into 8 DQ planes or subarrays. Each plane has a density of 256K. In a normal write, data is simultaneously written to a memory cell in each DQ plane. One address determines which cell is written, and each selected cell has the same address location in each DQ plane. Since eight cells are written, a byte of information is stored in the array during the normal write operation. During a block write, a block of cells are written in each DQ plane. Address input port 39 receives signals for addressing the selected memory storage cell within each DQ plane.

Row address strobe (RAS), column address strobe (CAS), transfer or output enable (TR/OE), input special function (DSF), serial clock (SC), and write enable(WE) are external input signals on external input pins 40, 45, 50, 55, 60, and 65, respectively. These external input signals control internal timing and operation of a logic control generator 66. The logic control generator 66 generates an internal write signal, $W_1$. These input signals are well known to those skilled in the art. Descriptions of the circuit configuration, timing, and functions of the 2 Meg MT42C8256 are found on pages 5–111 through 5–152 of the 1992 DRAM Electrical data BOOK by Micron Technology, Inc. and are herein incorporated by reference. The MT42C8256 is similar to the 2 Meg shown in FIG. 3.

In order to better understand the function of $W_1$ it is necessary to have a better understanding of the configuration shown in FIG. 3. The SAM has been split into 8 subarrays in order that data may be transferred between a SAM subarray and a corresponding DQ subarray. Transfer gates 77, when activated, transfer electrical data between the DRAM portion 38 of the chip 34 and the SAM portion 36. A write transfer occurs when the data is transferred from the SAM to the DRAM, and read transfer occurs when the data is transferred from the DRAM to the SAM. The control signal $W_1$ controls the operation of the transfer gates 77.

In the normal and block write modes electrical digital data is read from or written to the DRAM portion 38. $W_1$ controls the normal and block write operation through the normal and block write control unit 80.

Due to the fact that ASCII codes need 8 bits of information, no less than 8 subarrays have typically been written at any one time. In this type of accessing a byte of electrical data can be written. However, when processing graphic data, a VRAM may have to work with a chunk of data at one time having 4, 8, 12, 16, 24, or 32 bits. This is due to the fact that the VRAM may be processing either gray scale or color data. There exists a need to provide a VRAM wherein a nibble of electrical data can be written to the monolithic memory chip. A need also exists to control the write to individual banks in the memory array independently of one another in order that one bank may be written during the same memory cycle that another bank is read.

SUMMARY OF THE INVENTION

The invention is a monolithic memory chip having at least two external write control pins for accepting and responding to at least two external write enable signals. Subarrays of the memory chip are divided into at least two portions or banks wherein each portion is seen as an individual memory sub-chip with respect to its external write control pin. In the method of the invention the chip generates at least two internal write signals, $W_1$ and $W_2$, in response to the external write enable signals. Each internal write signal controls write functions to one of the sub-chips. During a single memory cycle a first sub-chip can be written independently of a second sub-chip. Therefore the second sub-chip may be read during the memory cycle in which the write of the first sub-chip is being performed. Similarly a write transfer can be executed on one sub-chip and a read transfer executed on another sub-chip during a single memory cycle.

In a further embodiment of the invention each sub-chip comprises four subarrays, and the inventive method allows the user to write a nibble of data to the VRAM.

It is an advantage of the invention that any sub-chip of subarrays can be written independent of the other sub-chips. This can be accomplished through the RAM port during a normal or during a block write operation or through the SAM port during a write transfer operation. Thus the VRAM of the invention provides more versatility to the designer than previous VRAMs. Each sub-chip is not automatically put in a write mode in the circuit of the invention.

DETAILED DESCRIPTION OF THE INVENTION

Figure 1:
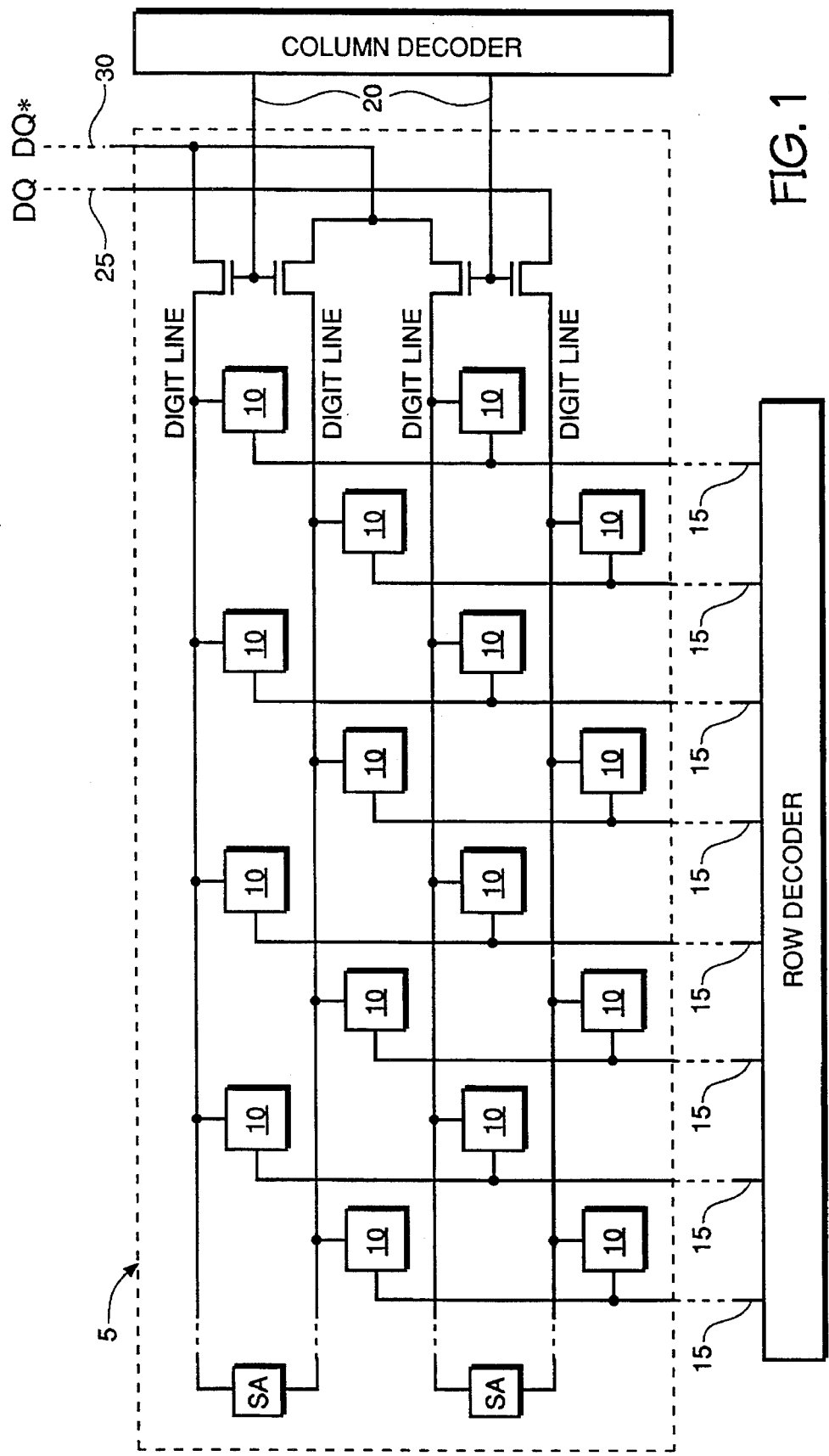
FIG. 1 is a block schematic of a monolithic dynamic random access memory array of the related art.
Figure 2:
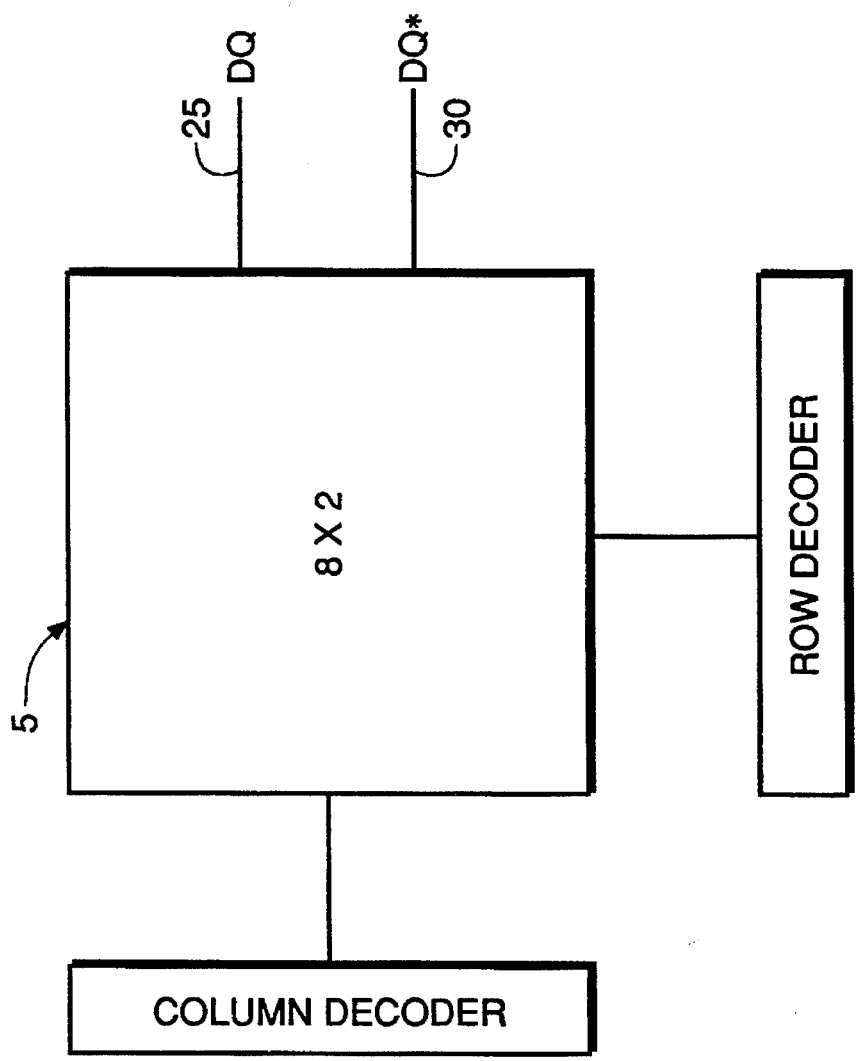
FIG. 2 is a block diagram of the schematic of FIG. 1.
Figure 3:
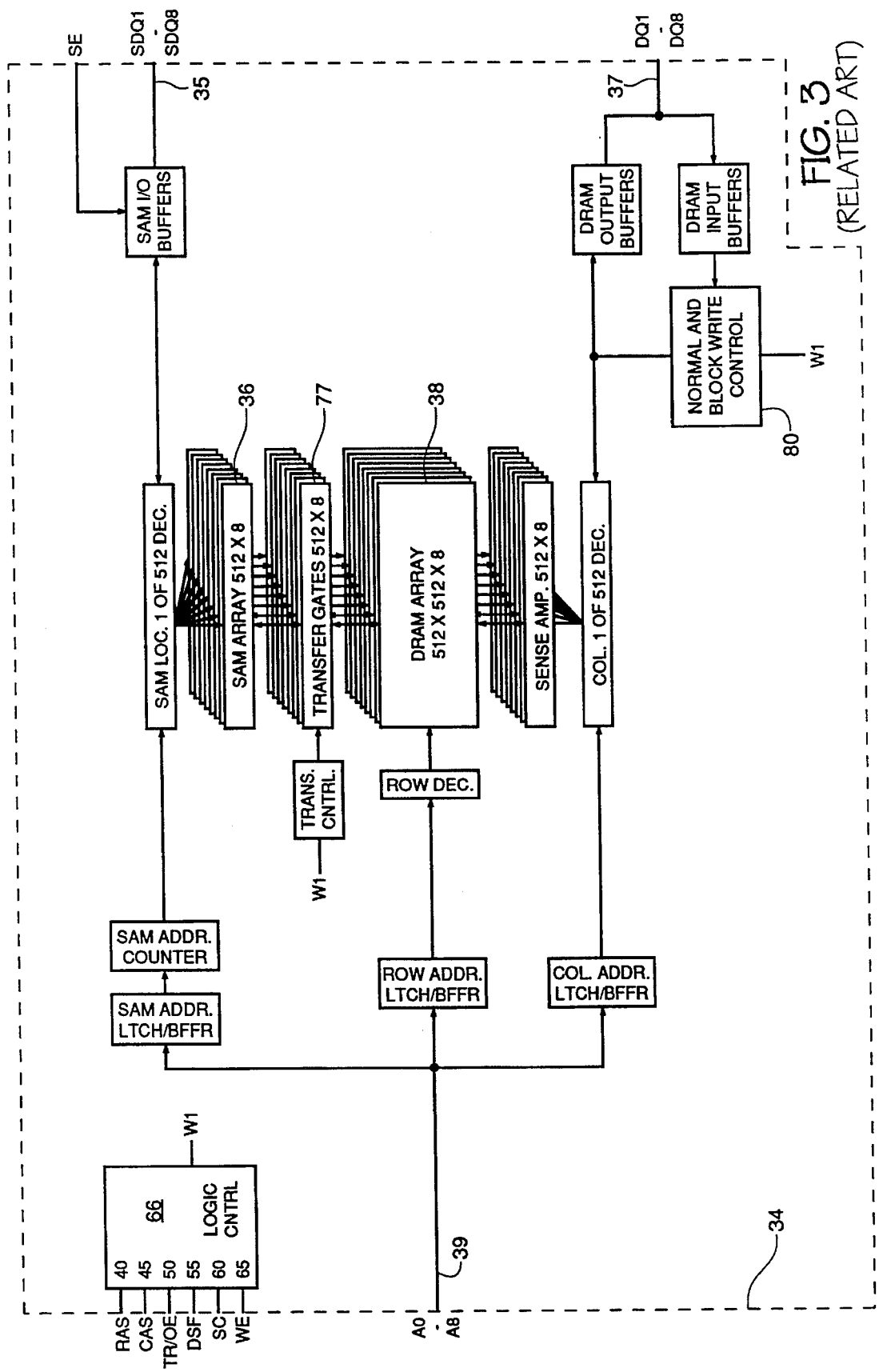
FIG. 3 is a block diagram of a monolithic video random access memory (VRAM) chip the related art.
Figure 4:
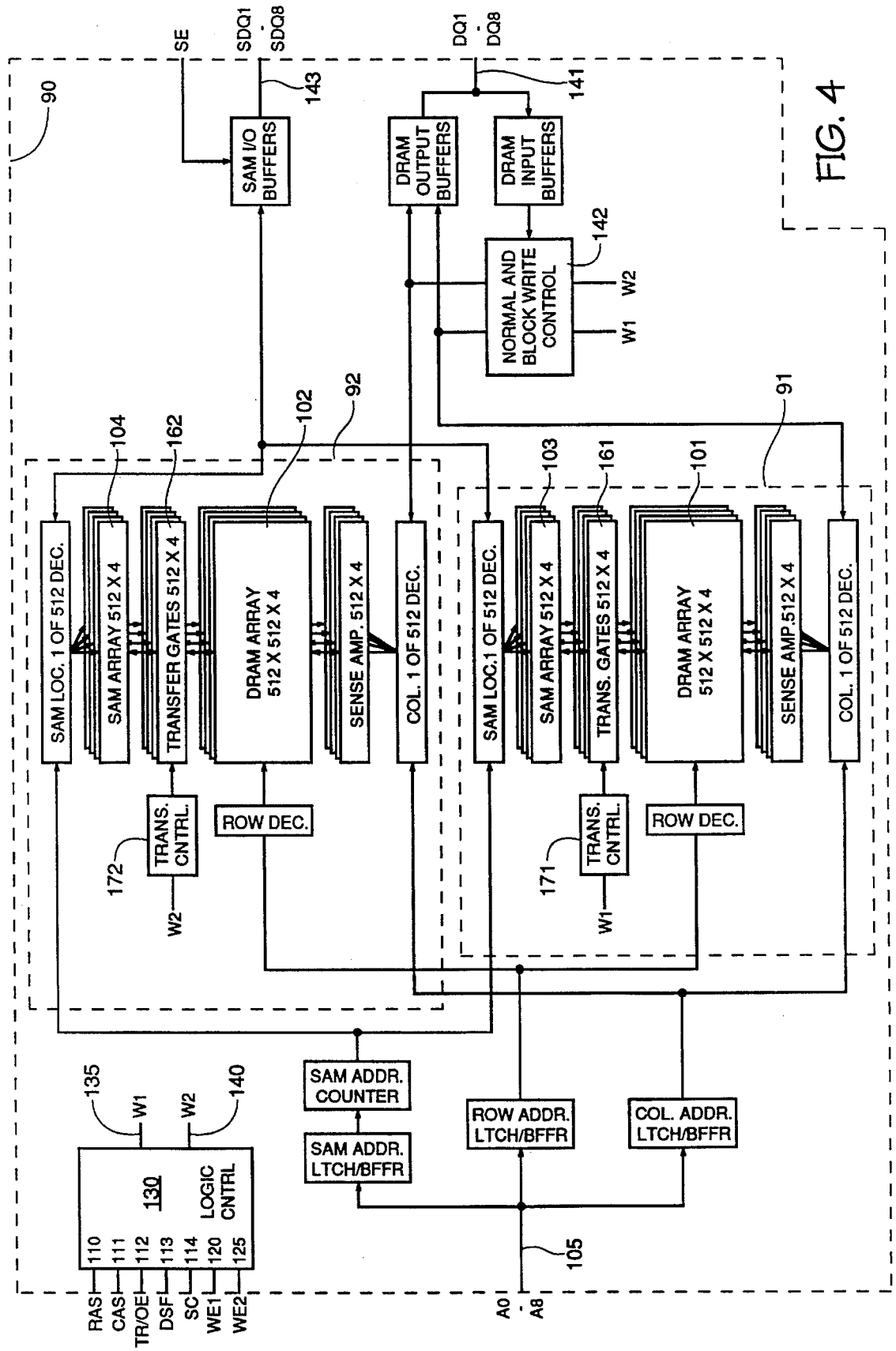
FIG. 4 is a block diagram of the monolithic VRAM chip of the invention.

FIG. 4 is a block diagram of an embodiment of the invention featuring a monolithic video random access memory (VRAM) chip 90. The VRAM 90 of FIG. 4 consists of two sub-chips 91 and 92. Each sub-chip 91 and 92 has a dynamic random memory (DRAM) bank 101 and 102, respectively, of four subarrays and a serial access memory (SAM) bank 103 and 104, respectively, of four subarrays. Each subarray of DRAM banks 101 and 102 is a dynamic random access memory having a matrix of memory storage cells formed at an intersection of a row and a column. An address on address input port 105 determines a row and column location. Each row and column location selects a corresponding memory storage cell in each subarray. In the circuit of FIG. 4 each subarray has a density equal to 256K. Since there are 4 subarrays in each subchip 91 and 92, each subchip 91 and 92 is configured as a 256K×4. Since there are two subchips the total density of the chip 90 is equal to 2 Meg.

External input pins 110, 111, 112, 113, and 114 receive external input signals RAS, CAS, TR/OE, DSF and SC respectively, where RAS is a row address strobe signal, CAS is a column address strobe signal, TR\OE is either a transfer or an output enable signal, DSF is an input special function signal, and SC is a serial clock signal. External write control pin 120 receives a first external input write enable signal, and external write control pin 125 receives a second external input write enable signal. The input signals are responsible for controlling the transfer of data within the chip and are well known to those skilled in the art. An internal timing and logic control generator 130 generates two internal write signals, $W_1$ and $W_2$, at logic control circuit output nodes 135 and 140 in response to external signals RAS, CAS, TR\OE, DSF, $WE_2$, and $WE_1$. $W_1$ controls normal write operations, block write operations, and write transfer operations to sub-chip 91, and $W_2$ controls normal write operations, block write operations, and write transfer operations to sub-chip 92. Thus, each subarray 91 and 92 behaves as an independent sub-chip, and one sub-chip may be written while the other is read without the necessity of masking a write operation to the sub-chip being read.

Electrical digital data from a central processing unit (CPU), not shown, is available at DQs 1–8 at RAM port 141. The electrical data from the CPU can be written during either normal or block write operations. $W_1$ and $W_2$ are input signals to a normal and block write control circuit 142. The normal and block write control circuit generates a signal in response to $W_1$ and generates a signal in response to $W_2$ in order to control the normal and block writes in DRAM banks 101 and 102 respectively. Although a write operation may be performed to both banks during a single memory cycle one bank may be written while the other is read. For example, if $W_1$ is active for a block write to bank 101 and $W_2$ is inactive, a group of cells in each subarray of DRAM bank 101 is written. During the same cycle a read operation can be performed in DRAM bank 102. In another example, a cell is selected and written to in each subarray of DRAM bank 102 in a normal write operation, while a read operation is performed in DRAM bank 101.

In a write transfer operation electrical data is transferred from storage in the serial access memory (SAM) bank for storage in the corresponding DRAM bank. In this case the electrical data is video data. In FIG. 4 the SAM banks 103 and 104 are electrically coupled to a SAM port 143 having SDQs 1–8. SDQs are DQs for coupling video data to and from a SAM. The SAM banks 103 and 104 receive video input data from the SDQs for storage during a serial write operation and video data stored in the SAM banks 103 and 104 is read at the SDQs during a serial read operation. For each DRAM subarray there exists a corresponding SAM subarray. Transfer gates are electrically interposed between each SAM bank and its corresponding DRAM bank, and the transfer gates control the transfer of data between the two banks. A transfer control circuit 171 responds to internal write signal $W_1$, and transfer control circuit 172 responds to internal write signal $W_2$. Transfers control circuits 171 and 172 generate signals which control the activation and deactivation of the transfer gates 161 and 162 respectively. When activated by the transfer control circuit the transfer gates transfer a row of data between each SAM subarray and a corresponding DRAM subarray. The transfer of data from the SAM bank to the DRAM bank is known as a write transfer operation, and the transfer of data from the DRAM bank to the SAM bank is known as a read transfer operation. With the circuit of the invention the write transfer operations of each bank are independent of each other. Thus a write transfer can be performed to one of the two banks during the same memory cycle that a read transfer operation is performed to the remaining bank.

Since each bank of the chip has four subarrays a write transfer from each of the 4 SAM subarrays to its corresponding four DRAM subarrays may be performed. For example, a row of data may be write transferred from each subarray of the SAM bank 103 to the DRAM bank 101 in response to an active $W_1$ at transfer control circuit 171. The transfer control circuit 171 generates a signal which activates the transfer gates 161 in order that the write transfer may be performed. If $W_2$ is inactive a read transfer operation may be performed in banks 102 and 104 during the same memory cycle, or if $W_2$ is active a write transfer of data from SAM bank 104 to DRAM bank 102 is performed during the same memory cycle. The memory functions of banks 102 and 104 are independent of the memory functions of banks 101 and 103, and the write transfer in one bank is performed without masking a write transfer in the remaining bank.

Thus using the circuit of the invention it is possible to perform a write operation to one bank of subarrays independent of the memory function performed in another bank of subarrays. Each bank can be written without masking a write to a bank not being written. Since each bank consists of four subarrays the circuit provides previously unheard of independent nibble control, wherein a nibble of data is written to the VRAM without masking.

Although the invention has been described in terms of a 2 Meg VRAM, the circuit and method have utility in other circuits where it is desired to write to a bank of subarrays independently of other banks on the chip without masking of the other banks. Accordingly the invention should be read as limited only by the claims.

What is claimed is:

1. A memory circuit for storing electrical data, the memory circuit fabricated as a monolithic chip, comprising:

a) a plurality of memory banks, each memory bank comprising a plurality of memory subarrays, each memory subarray comprising a matrix of memory storage cells for storing the electrical data;

b) a plurality of external write control pins, such that there exists at least one of said external write control pins for each said memory bank of said plurality of memory banks, each said external write control pin of said plurality of external write control pins accepting a unique external write enable signal; and c) a generating means for generating an internal write enable signal in response to each said external write enable signal, such that a plurality of said internal write enable signals are generated by said generating means, each of said internal write enable signals controlling a write function for a corresponding said memory bank, wherein an active internal write enable signal specifies a write function to be performed to its corresponding said memory bank.

2. The memory circuit as specified in claim 1, wherein each of said memory banks of said plurality of memory banks comprises four of said memory subarrays.

3. The memory circuit as specified in claim 1, wherein said electrical data is written to said memory cells of said memory banks having said active internal write enable signal independent of a memory function performed on said memory banks having an inactive internal write enable signal.

4. The memory circuit as specified in claim 1, wherein said electrical data is written to said memory cells of said memory banks having said active internal write enable signal without a masking of a write function to said memory banks of said plurality of memory banks.

5. A monolithic video random access memory chip for storing electrical data, comprising:

a) a first bank of four dynamic random access memory subarrays;

b) a second bank of four dynamic random access memory subarrays; and c) logic control circuitry for providing a first internal write signal to control a write of the electrical data to a memory storage cell in each of said dynamic random access memories of said first bank and for providing a second internal write signal to control a write of the electrical data to a memory storage cell in each of said dynamic random access memories of said second bank, the video random access memory chip thereby having a nibble write control function.

6. The video random access memory chip as specified in claim 5, wherein said subarrays of said first and said second bank are written independently of one another in response to said first and said second internal write signals respectively.

7. The video random access memory chip as specified in claim 5, wherein said nibble write control function is provided without masking of said write of electrical data to said first bank and without masking of said write of electrical data to said second bank.

8. The video random access memory chip as specified in claim 5, further comprising:

a) a first external input pin for accepting a first external write enable signal; and b) a second external input pin for accepting a second external write enable signal, and wherein said logic control circuitry is in electrical communication with said first and said second external input pins, said logic control circuitry generating said first and said second internal write signals in response to said first and said second external write enable signals.

9. The video random access memory chip as specified in claim 5 wherein the electrical data represents a video image.

10. The video random access memory chip as specified in claim 9, further comprising:

a) a serial access memory port for accepting the electrical data representing said video image;

b) a first serial access memory coupled to said serial access memory port;

c) a second serial access memory coupled to said serial access memory port;

d) first transfer gates electrically interposed between said first bank and said first serial access memory portion,
said first transfer gates transferring said electrical data representing said video image to said first bank from said first serial access memory portion when activated by said first internal write signal; and e) second transfer gates electrically interposed between said second bank and said second serial access memory portion,
said second transfer gates transferring said electrical data representing said video image to said second bank from said second serial access memory portion when activated by said second internal write signal.

11. A method for writing electrical data to a monolithic video random access memory chip having a plurality of memory banks, each memory bank having a plurality of memory subarrays, comprising the following steps:

a) receiving an external plurality of external write enable signals;

b) generating an internal plurality of internal write signals in response to said external plurality of external write enable signals; and c) independently writing the electrical data to one memory bank of the plurality of memory banks without regard to a memory function performed on remaining memory banks of the plurality of memory banks such that a memory cell in each of said subarrays of said one bank is written, said step of writing performed in response to at least one of said plurality of internal write signals.

12. The method as specified in claim 11, further comprising performing said step of writing without masking a write operation to any of the memory banks of the plurality of memory banks.

13. The method as specified in claim 11, wherein said step of writing further comprises writing a nibble of electrical data.

14. A method for writing electrical data to a monolithic video random access memory chip having a plurality of memory banks, each memory bank having four memory subarrays, the method comprising the step of:

writing said electrical data to a memory storage cell in each of the subarrays of one memory bank, wherein said step of writing comprises the steps of, receiving a plurality of external write enable signals;

generating a plurality of internal write signals; and controlling said step of writing to the memory storage cell in said each subarray of said one memory bank with a corresponding one of said plurality of said internal write enable signals.

15. The method as specified in claim 14, wherein said step of writing is performed without masking a write operation to any of the memory banks of the plurality.

16. A method for storing electrical data in a monolithic memory chip comprising the step of:

writing data to a memory storage cell in each of a plurality of subarrays of a memory bank without masking a write operation to memory storage cells in at least a second memory bank, wherein said step of writing data comprises the steps of, receiving a plurality of external write enable input signals;

generating a plurality of internal write signals in response to said plurality said external write enable signals; and performing said step of writing in response to one of said plurality of internal write signals.

17. The method as specified in claim 16, wherein the step of writing further comprises writing a nibble of information to the memory chip.

18. A method for writing first electrical input data to a memory storage cell in each one of a plurality of subarrays which form a first bank of subarrays within a monolithic memory chip having said first bank and at least a second bank of a plurality of subarrays, comprising the following steps:

a) addressing the memory chip in order to select the memory storage cell to be written in each of the subarrays of the first bank;

b) receiving a plurality of external write enable signals;

c) generating an internal write signal in response to at least one of said plurality of external write enable signals;

d) generating at least a second internal write signal in response to at least one of said plurality of external write enable signals; and e) writing the first electrical input data to the memory storage cell selected in each of the subarrays of the first bank in response to said first internal write signal, said step of writing performed independently from a memory function performed on at least said second bank.

19. The method as specified in claim 18, wherein said memory function comprises reading electrical output data from at least said second bank.

20. The method as specified in claim 18, wherein said memory function comprises writing a second electrical input data to at least said second bank.

21. The method as specified in claim 18, wherein said step of writing the first electrical input data comprises writing said first electrical input data from a first secondary memory storage device to said first bank.

22. The method as specified in claim 21, wherein said memory function comprises a read transferring of electrical output data from said second bank to a second secondary memory storage device.

23. The method as specified in claim 21, wherein said memory function comprises write transferring second electrical input data to at least said second bank from said secondary memory storage device.

24. The method as specified in claim 18, wherein said step of writing comprises writing a nibble of data to said first bank.

25. A method for writing first electrical data to a monolithic video random access memory chip having a plurality of memory storage cells, said first electrical data written to a selected memory storage cell of the plurality of memory storage cells in each of four subarrays of a first bank of subarrays within the monolithic video random access memory chip, said monolithic video random access memory chip having a second bank having four subarrays, comprising the following steps:

a) addressing the video random access memory chip in order to select the selected memory storage cell in each of the four subarrays of the first bank to be written;

b) receiving a first external write enable signal;

c) receiving a second external write enable signal;

d) generating an internal first write signal in response to at least said first external write enable signal;

e) generating an internal second write signal in response to at least said second external write enable signal; and f) writing the first electrical data to the memory storage cells selected in the first bank during said step of addressing in response to said internal first write signal.

26. The method as specified in claim 25, wherein said step of writing said first electrical data comprises transferring said first electrical data from a row of the memory storage cells in a first secondary storage device to a row of the memory storage cells in said first bank.

27. The method as specified in claim 25, wherein said step of writing said first electrical data comprises writing said first electrical data to a plurality of the memory storage cells in each of the four subarrays of the first bank.

28. The method as specified in claim 25, further comprising performing said step of writing to said first bank without masking of a write operation to said second bank.

29. The method as specified in claim 25, further comprising performing a memory function in said second bank independently of said step of writing.

30. The method as specified in claim 29, wherein said step of performing said memory function comprises second reading electrical data stored in said second bank.

31. The method as specified in claim 29, wherein said step of performing said memory function comprises writing second electrical data to the subarrays of the second bank in response to said second internal write signal.

32. The method as specified in claim 31, wherein said step of writing said second electrical data comprises transferring said second electrical data from a row of the memory storage cells in a second secondary storage device to a row of the memory storage cells in said second bank.

33. A memory circuit for storing electrical data, the memory circuit fabricated as a monolithic chip, comprising:
   a) a plurality of memory banks, each memory bank comprising a plurality of memory subarrays, each memory subarray comprising a matrix of memory storage cells for storing the electrical data;
   b) a plurality of external write control pins, such that there exists at least one of said external write control pins for each said memory bank of said plurality of memory banks; and
   c) a signal generating assembly in electrical communication with at least one of said external write control pins, said signal generating assembly configured to generate an internal write enable signal in response to an appropriate external signal applied to said external write control pin, said internal write enable signal controlling a write function for a selected memory bank of said plurality of memory banks.

34. A computer system, comprising:
   a) an address input port for accepting an address from the computer system;
   b) a plurality of memory banks, each memory bank comprising a plurality of memory subarrays, each memory subarray comprising a matrix of memory storage cells for storing the electrical data;
   c) a plurality of external write control pins, such that there exists at least one of said external write control pins for each said memory bank of said plurality of memory banks, said external write control pins receiving control signals from the computer system; and
   d) a signal generating assembly in electrical communication with at least one of said external write control pins, said signal generating assembly configured to generate an internal write enable signal in response to an appropriate external signal applied to said external write control pin, said internal write enable signal controlling a write function for a selected memory bank of said plurality of memory banks.

35. A method for writing electrical data to a monolithic video random access memory chip having a plurality of memory banks, each memory bank having a plurality of memory subarrays, comprising the following steps:
   a) receiving an external plurality of external write enable signals;
   b) generating an internal plurality of internal write signals in response to said external plurality; and
   c) independently writing the electrical data to one memory bank of the plurality of memory banks without regard to a memory function performed on remaining memory banks of the plurality of memory banks.

36. A method for writing first electrical input data to a memory storage cell in each one of a plurality of subarrays which form a first bank of subarrays within a monolithic memory chip having said first bank and at least a second bank of a plurality of subarrays, comprising the following steps:
   a) addressing the memory chip in order to select the memory storage cell to be written in each of the subarrays of the first bank;
   b) receiving a plurality of external write enable signals;
   c) generating an internal write signal in response to at least one of said plurality of external write enable signals; and
   d) writing the first electrical input data to the memory storage cell selected in each of the subarrays of the first bank in response to said first internal write signal, said step of writing performed independently from a memory function performed on at least said second bank.

37. A method for writing first electrical data to a monolithic video random access memory chip having a plurality of memory storage cells, said first electrical data written to a selected memory storage cell of the plurality of memory storage cells in each of four subarrays of a first bank of subarrays within the monolithic video random access memory chip, said monolithic video random access memory chip having a second bank having four subarrays, comprising the following steps:
   a) addressing the video random access memory chip in order to select the selected memory storage cell in each of the four subarrays of the first bank to be written;
   b) receiving a first external write enable signal;
   c) generating an internal first write signal in response to at least said first external write enable signal; and
   d) writing the first electrical data to the memory storage cells selected in the first bank during said step of addressing in response to said internal first write signal.

* * * * *